(12) United States Patent
Shirouzu

(10) Patent No.: US 9,462,727 B2
(45) Date of Patent: Oct. 4, 2016

(54) LC FILTER HAVING A FUNCTION TO COOL AC REACTOR

(71) Applicant: FANUC CORPORATION, Yamanashi (JP)

(72) Inventor: Masatomo Shirouzu, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 14/722,594

(22) Filed: May 27, 2015

(65) Prior Publication Data

US 2015/0351278 A1    Dec. 3, 2015

(30) Foreign Application Priority Data

May 30, 2014    (JP) ................................. 2014-112919

(51) Int. Cl.
| | |
|---|---|
| *H05K 7/20* | (2006.01) |
| *H01F 27/08* | (2006.01) |
| *H03H 7/01* | (2006.01) |
| *H01F 27/24* | (2006.01) |
| *H01F 27/28* | (2006.01) |

(Continued)

(52) U.S. Cl.
CPC ........ *H05K 7/20009* (2013.01); *H01F 27/025* (2013.01); *H01F 27/085* (2013.01); *H01F 27/24* (2013.01); *H01F 27/28* (2013.01); *H03H 7/17* (2013.01); *H05K 5/0213* (2013.01); *H05K 7/2089* (2013.01); *H05K 7/20127* (2013.01)

(58) Field of Classification Search
CPC .... H01F 27/025; H01F 27/08; H01F 27/085; H01F 27/2876; H05K 7/20009–7/20127; H05K 7/2089
See application file for complete search history.

(56) References Cited

U.S. PATENT DOCUMENTS

| | | | | |
|---|---|---|---|---|
| 5,371,442 A * | 12/1994 | Siems | ................... | H05B 41/00 315/227 R |
| 7,161,456 B2 * | 1/2007 | Knox | ................... | H01F 27/385 336/90 |
| 7,728,544 B2 * | 6/2010 | Qian | ................... | H02M 1/126 318/799 |

(Continued)

FOREIGN PATENT DOCUMENTS

| | | |
|---|---|---|
| JP | S57004216 U | 1/1982 |
| JP | S57044521 U | 3/1982 |

(Continued)

OTHER PUBLICATIONS

Untranslated Decision to Grant a Patent for Japanese Application No. 2014-112919, Date of Mailing: Jan. 5, 2016, 3 pages.

(Continued)

*Primary Examiner* — Robert J Hoffberg
(74) *Attorney, Agent, or Firm* — Fredrikson & Byron, P.A.

(57) ABSTRACT

The LC filter includes a first AC reactor having a first core and a first coil whose terminal is connected to an AC power source, a second AC reactor having a second core and a second coil whose terminal is connected to a power convertor which converts AC to DC, a capacitor, a casing to house these components, a cooling air introduction portion which introduces cooling air into the casing, and a cooling air discharge portion which discharges the cooling air from the casing in a predetermined direction. The second AC reactor is positioned so as to provide a second gap between the outer periphery of the second coil and the casing, and so that the axial direction of the second coil coincides with the flow direction of the cooling air flowing along the second gap.

7 Claims, 4 Drawing Sheets

(51) Int. Cl.
*H05K 5/02* (2006.01)
*H01F 27/02* (2006.01)

(56) References Cited

U.S. PATENT DOCUMENTS

| | | | | |
|---|---|---|---|---|
| 8,120,907 | B2* | 2/2012 | Chen | H01L 23/467 |
| | | | | 361/690 |
| 8,773,851 | B2* | 7/2014 | Shigeno | H05K 7/20918 |
| | | | | 165/185 |
| 8,971,068 | B2* | 3/2015 | Pu | H02M 1/126 |
| | | | | 363/44 |
| 9,083,234 | B2* | 7/2015 | Shudarek | H02M 1/126 |
| 2015/0145523 | A1* | 5/2015 | Harada | G01R 31/42 |
| | | | | 324/538 |
| 2015/0303894 | A1* | 10/2015 | Shudarek | H02M 1/126 |
| | | | | 333/177 |

FOREIGN PATENT DOCUMENTS

| | | |
|---|---|---|
| JP | 2005287183 A | 10/2005 |
| JP | 2007221858 A | 8/2007 |
| JP | 2008259343 A | 10/2008 |
| JP | 2012210115 A | 10/2012 |

OTHER PUBLICATIONS

Translated Decision to Grant a Patent for Japanese Application No. 2014-112919, Date of Mailing: Jan. 5, 2016, 3 pages.
Untranslated Notification of Reasons for Refusal for Japanese Application No. 2014-112919, Date of Mailing: Oct. 6, 2015, 2 pages.
Translated Notification of Reasons for Refusal for Japanese Application No. 2014-112919, Date of Mailing: Oct. 6, 2015, 2 pages.
English Abstract and Machine Translation for Japanese Publication No. 2007-221858, published Aug. 30, 2007, 13 pgs.
English Translation of Abstract for Japanese Publication No. 2012210115, published Oct. 25, 2012, 1 page.
English Translation of Abstract for Japanese Publication No. 2008259343, published Oct. 23, 2008, 1 page.
English Translation of Abstract for Japanese Publication No. 2005287183 published Oct. 13, 2005, 1 page.

* cited by examiner

LC FILTER HAVING A FUNCTION TO COOL AC REACTOR

CROSS-REFERENCE TO RELATED APPLICATIONS

This application is a new U.S. patent application that claims benefit of JP 2014-112919, filed on May 30, 2014, the entire content of JP 2014-112919 is hereby incorporated by reference.

FIELD OF THE INVENTION

The present invention relates to an LC filter used in a power converter which converts AC voltage to DC voltage or DC voltage to AC voltage, and in particular relates to an LC filter having a function for cooling an AC reactor.

BACKGROUND OF THE INVENTION

A PWM converter is known as a device which performs switching control performed by PWM to thereby suppress a harmonic current included in a load current for an AC power source driving a motor driving device in order to improve power.

A PWM converter outputs a square wave AC voltage including high frequencies of several kHz or more on a path between the AC power supply and the PWM converter to perform switching control by the PWM. As the square wave AC voltage includes high frequency components not included in the power supply frequency, this type of PWM converter is generally configured to provide a low pass filter (LC filter) which allows a high frequency square wave AC voltage to pass between the AC power source and the converter in order to remove the high frequency waves.

FIG. 1 illustrates an example of a basic configuration of an LC filter. FIG. 1 illustrates a configuration where the LC filter 1001 is positioned between the PWM converter 1002 and a three-phase AC power supply 1000.

The LC filter 1001 for the PWM converter is configured to be equipped with a so called T-filter which comprises capacitors C1 to C3 whose ends have an inductance of La1 to La3 and Lb1 to Lb3 respectively. Generally two AC reactors 1010 and 1020 for realizing two inductances have similar configurations (the cores are positioned in the same direction). Further, in general, AC reactors are of a natural air cooling type (for example Japanese unexamined patent publication No. 2007-221858 (JP 2007-221858 A)).

Regarding the inductances L of the two AC reactors 1010 and 1020, in order to suppress the peak of the high frequency current flowing in from the PWM converter 1002 side, the L of the PWM converter side increases and the L of the AC power source 1000 side decreases. Therefore, in general, the volume of the AC reactor B (1020) on the PWM convertor side is comparatively larger than that of the AC reactor A (1010) of the AC power source side. Further, in general, the outer shape of the AC reactor is a parallelepiped about which the coil is wound.

Further, a large part of the loss generated in inductance is on the PWM convertor side where high frequency current flows. Therefore, high frequency current only flows through the AC reactor B on the convertor side (1020) which further increases the temperature rise.

Conventionally, due to AC reactors being large and heavy, two AC reactors and a capacitor, etc., constituting an LC filter were not housed in the same casing.

If these two AC reactors were to be housed in the same casing, there would be a problem that a useless space would be created due to the difference in the height between the small AC reactor on the power source side and the large AC reactor on the convertor side and the volume of the casing would be large.

The object of the present invention is to enable efficient cooling of the AC reactors and provide an LC filter which allows miniaturization and reduction in weight of a casing which houses the LC filter part.

SUMMARY OF THE INVENTION

According to an embodiment of the present invention, the LC filter comprises a first AC reactor comprising a first core and a first coil wound around one portion of the first core wherein one terminal of the first coil is connected to an AC power source, and a second AC reactor comprising a second core and a second coil wound around one portion of the second core so as to provide a first gap therebetween, wherein one terminal of the second coil is connected to a power convertor which converts AC voltage to DC voltage, a capacitor which has one terminal connected to the other terminal of the first coil and the other terminal of the second coil, a casing which houses the first AC reactor, the second AC reactor and the capacitor, a cooling air introduction portion which is provided on one surface of the casing and which introduces cooling air, and a cooling air discharge portion which is provided on another surface of the casing opposite the one surface and which discharges the cooling air such that the cooling air flows in a predetermined direction, wherein the second AC reactor is positioned so as to provide a second gap between the outer periphery of the second coil and the casing, and the axial direction of the second coil coincides with the direction of the flow of the cooling air along the second gap.

BRIEF DESCRIPTION OF THE DRAWINGS

These and other features and advantages of the present invention will be better understood by reading the following detailed description, taken together with the drawings wherein.

DESCRIPTION OF THE PREFERRED EMBODIMENTS

The LC filter of the present invention will be described below with reference to the drawings. However, it should be noted that the technical scope of the present invention is not limited to these embodiments and includes the inventions described in the claims and the equivalent thereof.

First Embodiment

Figure 1:
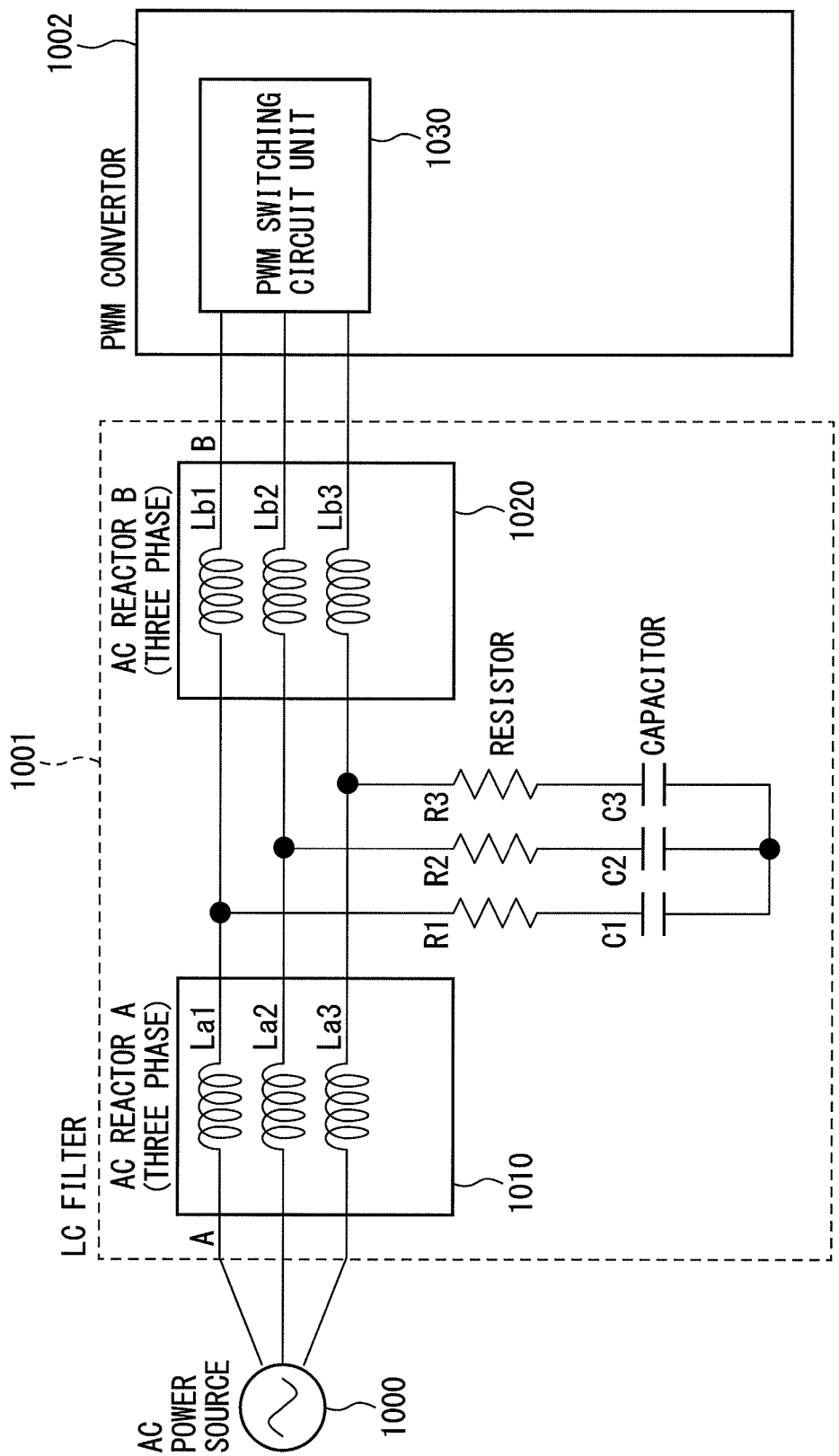
FIG. 1 is a block diagram of a conventional LC filter
Figure 2A:
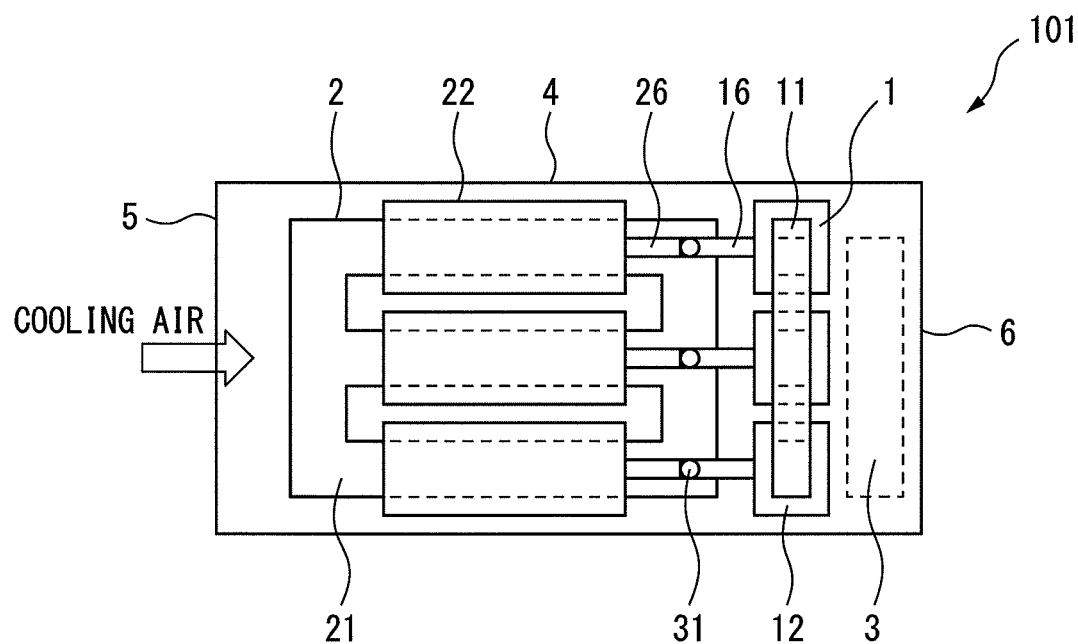
FIG. 2A is a plan view of the LC filter according to the first embodiment of the present invention.
Figure 2B:
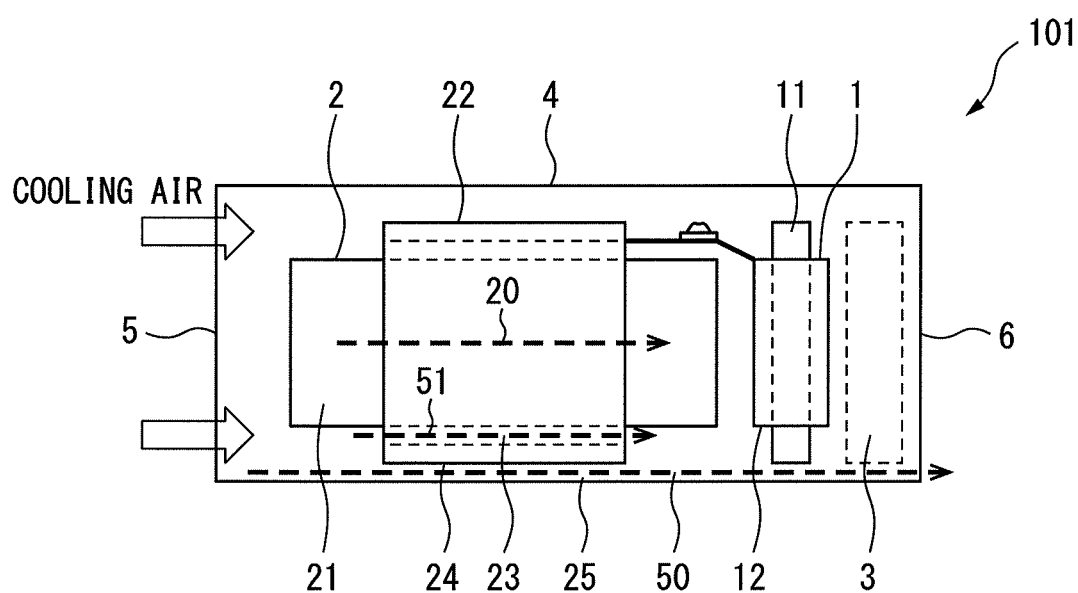
FIG. 2B is a lateral view of the LC filter according to the first embodiment of the present invention.

First, the LC filter according to the first embodiment of the present invention will be described with reference to the drawings. FIGS. 2A and 2B illustrate the configuration of the LC filter according to the first embodiment of the present invention. FIG. 2A is a plan view and FIG. 2B is a lateral view.

The LC filter 101 according to the first embodiment of the present invention comprises a first AC reactor 1 comprising a first core 11 and first coils 12 wound around portions of the first core wherein one of the terminals of the first coil is connected to an AC power source, a second AC reactor 2 comprising a second core 21 and second coils 22 wound around portions of the second core wherein one terminal of the second coil is connected to a power convertor which converts AC voltage to DC voltage, a capacitor 3 which has one terminal connected to the other terminal 16 of the first coil 12 and the other terminal 26 of the second coil 22, a casing 4 housing the first AC reactor 1, the second AC reactor 2 and the capacitor 3, a cooling air introduction portion 5 provided on one surface of the casing which introduces cooling air and, a cooling air discharge portion 6 provided on the other surface of the casing opposite the one surface which discharges the cooling air such that the cooling air flows in a predetermined direction, wherein the second AC reactor 2 is positioned to provide a second gap 25 between the outer periphery 24 of the second coil 2 and the casing 4, and the axial direction 20 of the second coil coincides with the direction 50 of the flow of the cooling air along the second gap.

The iron cores of the first core 11 of the first AC reactor 1 and the second core 21 of the second AC reactor 2 respectively comprise a single iron core made of a magnetic material such as ferrite.

The first coil 12 is wound around a portion of the first core 11 and the second coil 22 is wound around a portion of the second core 21. Further, as illustrated in FIG. 2B, a first gap 23 is formed between the second core unit 21 of the second AC reactor 2 and the second coil 22 and a second gap 25 is provided between the outer periphery 24 of the second coil 22 of the second AC reactor 2 and the casing 4.

The casing 4 is provided with a cooling air introduction portion 5 and a cooling air discharge portion 6, the cooling air sent from a cooling device (not illustrated) such as a fan which is disposed on the outer part of the casing 4, flows toward the cooling air discharge portion 6 from the cooling air introduction portion 5. At this time, as illustrated in FIG. 2B, cooling air flows through the second gap 25 in the direction of the arrow 50 and through the first gap 23 in the direction of the arrow 51.

In the LC filter 101 according to the first embodiment, the second AC reactor 2 is arranged so that the axial direction 20 of the second coil 22 of the second AC reactor 2 coincides with the direction 50 of the flow of the cooling air along the second gap 25. Furthermore, the axial direction 20 of the second coil 22 of the second AC reactor 2 coincides with the direction 51 of the flow of the cooling air along the first gap 23. As a result, the cooling air can effectively cool the second coil 22.

Further, FIG. 2B illustrates cooling air flow passages 50 and 51 which are formed near the bottom surface of the casing 4, however, the cooling air flow passages are not limited to those illustrated, and it is preferable that the cooling air flow passages 50 and 51 be formed on all four surfaces of the casing 4 close to the second coil 22.

Furthermore, due to the arrangement in which the cooling air flow passages 50 and 51 are formed in the limited areas of the first gap 23 and the second gap 25, the flow rate of cooling air through the first gap 23 and the second gap 25 can be increased. As a result, the cooling efficiency of the second core 21 and the second coil 22 can be increased and the cooling efficiency can be increased.

Further, as a large part of the loss of inductance is generated in the second AC reactor 2 where high frequency current flows, high frequency current flows only through the second AC reactor 2 and the temperature increase of the second AC reactor 2 is larger than the temperature increase of the first AC reactor 1. Therefore, it is preferable that the second AC reactor 2 be located closer to the cooling air introduction portion 5 than the first AC reactor 1. As a result, it is possible to effectively cool the AC reactors.

In the LC filter according to the first embodiment of the present invention, as the second AC reactor which reaches a higher temperature is positioned so that the direction of the cooling air flow passages and the direction of the gaps neighboring the coils are the same, cooling air flows directly through the coils and the cores and the cooling efficiency can be improved.

Second Embodiment

Figure 3:
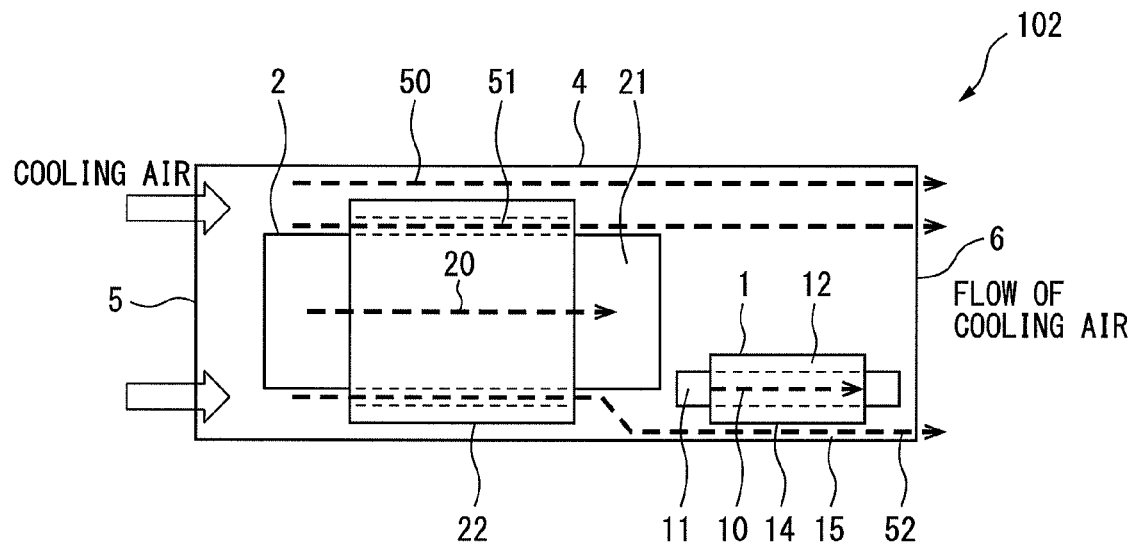
FIG. 3 is a lateral view of the LC filter according to the second embodiment.

Next, the LC filter according to the second embodiment of the present invention will be described with reference to the drawings. FIG. 3 illustrates a lateral view of the LC filter according to the second embodiment of the present invention. The difference between the LC filter 102 according to the second embodiment, and the LC filter 101 according to the first embodiment is that the first AC reactor 1 is positioned to provide a third gap 15 between the outer periphery 14 of the first coil 12 and the casing 4 and the axial direction 10 of the first coil 12 is positioned to coincide with the direction 52 of the flow of the cooling air along the third gap 15. The other configurations of the LC filter 102 according to the second embodiment are the same as the configurations of the LC filter 101 according to the first embodiment and therefore a detailed description thereof will be omitted. Further, the capacitor 3 illustrated in FIG. 2 has been omitted in FIG. 3 to simplify the description.

In the LC filter 102 of the second embodiment, the first AC reactor 1 and the casing 4 are positioned to provide the third gap 15 therebetween and the axial direction 10 of the first coil 12 and the direction 52 of the flow of cooling air along the third gap 15 coincide, and accordingly the first coil 12 can be efficiently cooled by the cooling air.

Furthermore, due to the arrangement in which the flow passage 52 for cooling air is formed in the limited area of the third gap 15, the flow rate of the cooling air flowing through the third gap 15 can be increased. As a result, the cooling efficiency of the first core 11 and the first coil 12 can be increased and cooling efficiency is improved.

Further, as illustrated in FIG. 3, the first AC reactor 1 is smaller than the second AC reactor 2. Because of this, among the four surfaces of the casing 4, only one or two surfaces are located close to the outer periphery 14 of the first coil 12 of the first AC reactor. The first AC reactor 1 is adjacent to the bottom surface of the casing 4 in the arrangement shown in FIG. 3 by way of example, but the arrangement is not limited thereto, and the first AC reactor 1 may be positioned adjacent to the side surface or the top surface of the casing 4. However, in the case that the temperature near the lower surface of the casing 4 is lower than that near the upper surface, the first AC reactor 1 is preferably positioned adjacent to the bottom surface of the casing 4.

Furthermore, as the first AC reactor 1 is positioned in an area closer to the cooling air discharge portion 6 than the second AC reactor 2, the cooling air flow passages near the second AC reactor 2 may be influenced by the position of the first AC reactor. Herein, it is preferable that the first AC reactor 1 be positioned so that the cooling air flows evenly in the vicinity of the second coil 22 of the second AC reactor 2. To this end, for example, the third gap 15 may be made larger than the second gap 25 (FIG. 2B). By doing this, it is possible to prevent the cool flow passage from being restricted by the third gap 15 and the flow of cooling air around the vicinity of the second coil 22 can be uniformly maintained.

According to the LC filter of the second embodiment the cooling efficiency of not only the second AC reactor but also the first AC reactor, can be enhanced, and accordingly, the cooling efficiency of the LC filter can be improved.

Third Embodiment

Figure 4:
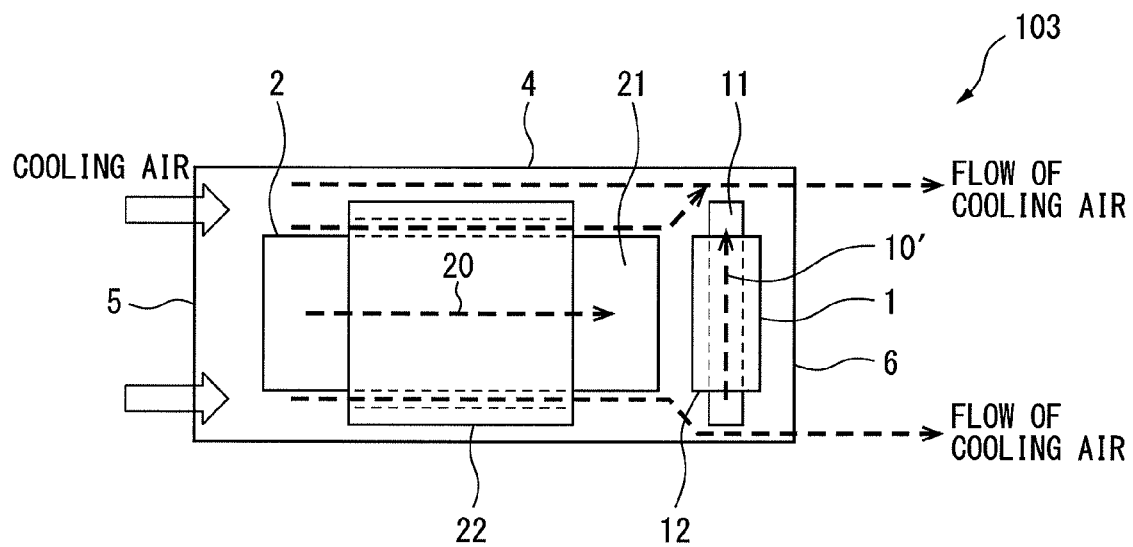
FIG. 4 is a lateral view of the LC filter according to the third embodiment.

Next, the LC filter according to the third embodiment of the present invention will be described with reference to the drawings. FIG. 4 illustrates a lateral view of the LC filter according to the third embodiment of the present invention. The LC filter 103 of the third embodiment differs from the LC filter 102 of the second embodiment in that the axis 10' of the first coil 12 of the first AC reactor 1 is positioned at a substantially 90 degree angle to the axis 20 of the second coil 22 of the second AC reactor 2. The other configurations of the LC filter 103 of the third embodiment are the same as the configurations of the filter 102 of the second embodiment so a detailed description thereof is omitted. Further, so as to simplify the description of FIG. 4, the capacitor 3 illustrated in FIG. 2 has been omitted.

According to the LC filter of the third embodiment, as the axis 10' of the first coil 12 of the first AC reactor 1 is positioned at a substantially 90 degree angle to the axis 20 of the second coil 22 of the second AC reactor 2, the first AC reactor 1 and the second AC reactor 2 may be positioned closer together. Because of this, the length of the casing 4 in the direction of the cooling air flow may be reduced, and wasteful space may be eliminated and the size of the casing 4 of the LC filter 103 can be miniaturized.

Further, as the first AC reactor 1 is positioned near the cooling air discharge portion 6, it is preferable that the first AC reactor 1 be positioned such that the flow of the cooling air around the area of the second coil 22 of the second AC reactor 2 is uniformly maintained. For example, as illustrated in FIG. 4, the distance between the first core 11 of the first AC reactor 1 and the bottom surface of the casing 4 is preferably the same as the distance between the first core 11 and the top surface of the casing. By doing this, the flow of the cooling air flowing near the second coil 22 of the second AC reactor can be made uniform and the second AC reactor 2 can be cooled evenly.

Moreover, it is preferable that the height of the second AC reactor and the height of the first AC reactor be substantially the same. In such a case, the distance between the second AC reactor and the casing 4 is equal to the distance between the first AC reactor 1 and the casing 4, and accordingly the flow of cooling air can be uniformly maintained around the second coil 22 of the second AC reactor 2. Furthermore, when designing an AC reactor such that the height of the first AC reactor and the second AC reactor match, it is preferable that the lamination thickness of the core is designed to be minimized to simplify the production.

Fourth Embodiment

Figure 5:
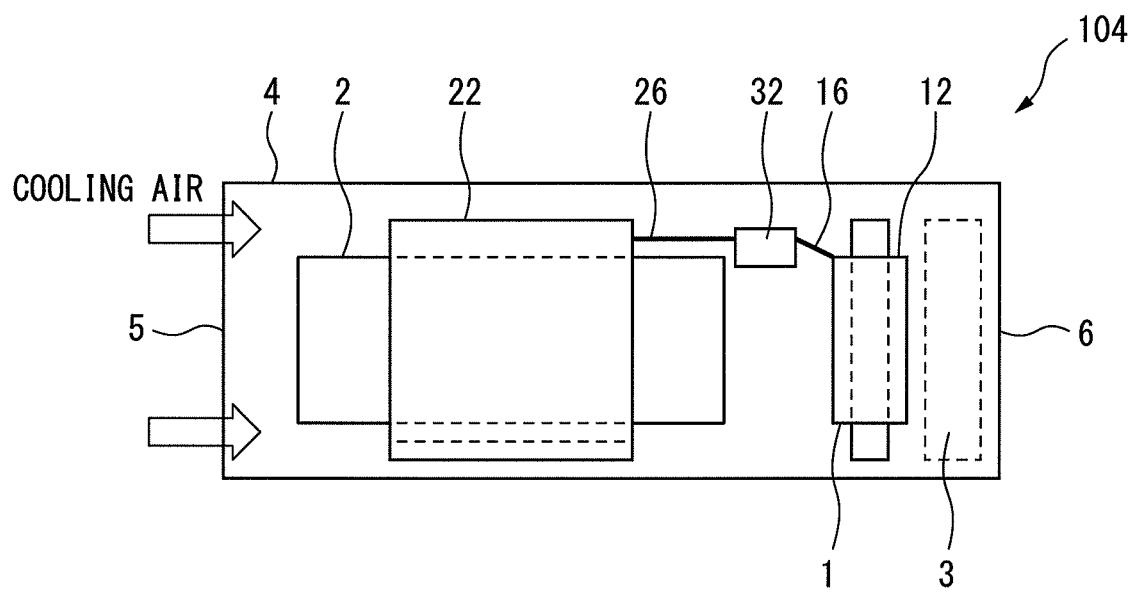
FIG. 5 is a lateral view of the LC filter according to the fourth embodiment.

Next, the LC filter according to the fourth embodiment will be described with reference to the drawings. FIG. 5 illustrates a lateral view of the LC filter of the fourth embodiment of the present invention. The LC filter 104 of the fourth embodiment is different from the LC filter 101 of the first embodiment in that the other terminal 16 of the first coil 12 and the other terminal 26 of the second coil 22 are directly connected to a terminal board 32. The other configurations of the LC filter 104 of the fourth embodiment are the same as the LC filter 101 of the first embodiment and as such a detailed description has been omitted.

According to the fourth embodiment of the LC filter, by directly connecting the terminals of the first AC reactor 1 and the second AC reactor 2, a cable etc. for relaying between the terminals of each AC reactor becomes unnecessary and the casing can be miniaturized. Note that when directly connecting the terminals, forming so-called unloaded holes in the terminals and fastening the terminals using nuts and screws, embedding an insert nut in one of the terminals and fastening a screw or bolt thereto, or attaching connectors to the terminals can be proposed.

Figure 6:
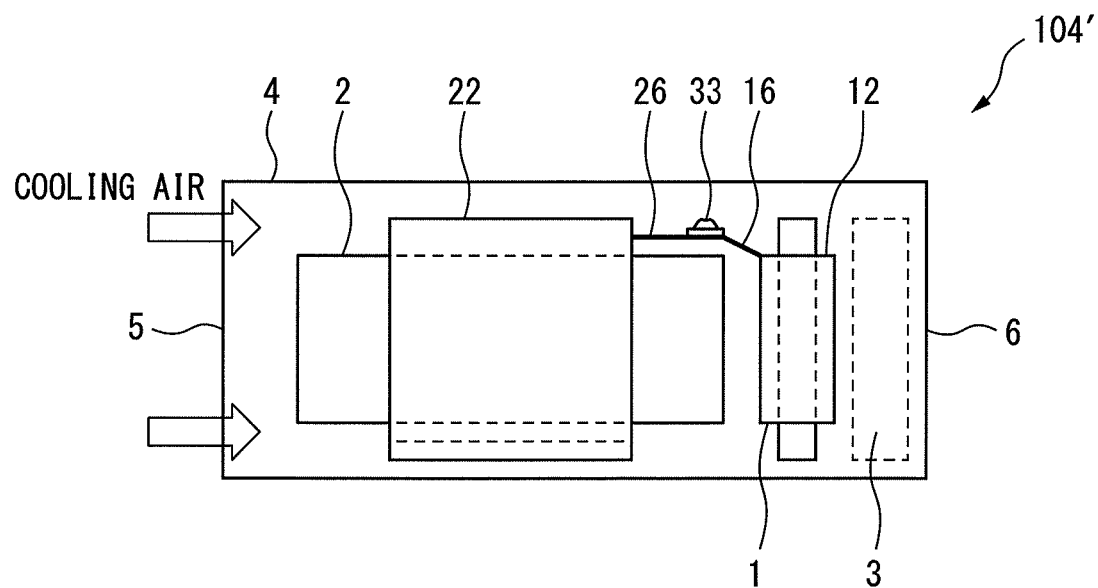
FIG. 6 is a lateral view of the LC filter according to a modification of the fourth embodiment according to the present invention.

FIG. 6 illustrates an alternative example of the LC filter of the fourth embodiment where the other terminal 16 of the first coil 12 and the other terminal 26 of the second coil 22 are directly connected by screw a 33.

The first AC filter 1 and the second AC filter 2 of the LC filters according to the embodiments of the present invention are of a three-phase, however the invention is not limited thereto and they may be of a single phase.

Further, the LC filter is independent from the power converter in the above description. However, a power converter may be equipped with the LC filter described above.

As described above, according to the present invention, the AC reactor can efficiently be cooled, and the miniaturization and weight reduction of the casing housing the LC filter can be achieved.

What is claimed is:

1. An LC filter comprising:
    a first AC reactor comprising a first core and a first coil wound around one portion of the first core wherein one terminal of the first coil is connected to an AC power source;
    a second AC reactor comprising a second core and a second coil wound around one portion of the second core so as to provide a first gap between the second core and the second coil, wherein one terminal of the second coil is connected to a power convertor which converts AC voltage to DC voltage, and the second AC reactor is larger than the first AC reactor;
    a capacitor which has one terminal connected to another terminal of the first coil and another terminal of the second coil;
    a casing housing the first AC reactor, the second AC reactor and the capacitor;
    a cooling air introduction portion provided on one surface of the casing to introduce cooling air; and
    a cooling air discharge portion provided on another surface of the casing opposite the one surface to discharge the cooling air such that a flow of the cooling air is in a predetermined direction,
    wherein the second AC reactor is positioned so as to provide a second gap between the outer periphery of the second coil and the casing, and so that an axial direction of the second coil coincides with the predetermined direction of the flow of the cooling air along the second gap.

2. The LC filter according to claim 1 wherein the first AC reactor is arranged such that a third gap is provided between an outer periphery of the first coil and the casing, and an axial direction of the first coil coincides with the predetermined direction of the flow of the cooling air along the third gap.

3. The LC filter according to claim 1 wherein the second AC reactor is positioned closer to the cooling air introduction portion than the first AC reactor.

4. The LC filter according to claim 1 wherein an axis of the first coil of the first AC reactor is positioned at a substantially 90 degree angle to an axis of the second coil of the second AC reactor.

5. The LC filter according to claim 4 wherein a height of the second AC reactor is substantially a same as a height of the first AC reactor.

6. The LC filter according to claim 1 wherein the another terminal of the first coil and the another terminal of the second coil are directly connected.

7. A power convertor fitted with the LC filter of claim 1.

* * * * *